(12) United States Patent
Sdrulla et al.

(10) Patent No.: US 11,830,943 B2
(45) Date of Patent: Nov. 28, 2023

(54) RF SIC MOSFET WITH RECESSED GATE DIELECTRIC

(71) Applicant: Analog Power Conversion LLC, Bend, OR (US)

(72) Inventors: Dumitru Gheorge Sdrulla, Bend, OR (US); Amaury Gendron-Hansen, Bend, OR (US)

(73) Assignee: ANALOG POWER CONVERSION LLC, Bend, OR (US)

(*) Notice: Subject to any disclaimer, the term of this patent is extended or adjusted under 35 U.S.C. 154(b) by 196 days.

(21) Appl. No.: 17/385,866

(22) Filed: Jul. 26, 2021

(65) Prior Publication Data
US 2023/0022394 A1 Jan. 26, 2023

(51) Int. Cl.
*H01L 29/78* (2006.01)
*H01L 29/66* (2006.01)
*H01L 29/16* (2006.01)
*H01L 29/423* (2006.01)

(52) U.S. Cl.
CPC ...... *H01L 29/7813* (2013.01); *H01L 29/1608* (2013.01); *H01L 29/4236* (2013.01); *H01L 29/66734* (2013.01)

(58) Field of Classification Search
CPC ............. H01L 29/7813; H01L 29/1608; H01L 29/4236; H01L 29/66734
USPC ...................................................... 257/330
See application file for complete search history.

(56) References Cited

U.S. PATENT DOCUMENTS

| | | |
|---|---|---|
| 8,436,367 B1 | 5/2013 | Sdrulla et al. |
| 8,674,439 B2 | 3/2014 | Sdrulla et al. |
| 9,530,844 B2 | 12/2016 | Zhang et al. |
| 10,804,175 B2 | 10/2020 | Matocha et al. |
| 2005/0215027 A1* | 9/2005 | Williams .......... H01L 29/66734 257/E29.066 |
| 2007/0120182 A1 | 5/2007 | Rouh et al. |
| 2012/0168856 A1* | 7/2012 | Luo .................... H01L 29/7813 257/330 |

(Continued)

OTHER PUBLICATIONS

International Search Report and Written Opinion for related PCT/US2022/037097, dated Nov. 4, 2022.

(Continued)

*Primary Examiner* — Igwe U Anya

(57) ABSTRACT

A Field Effect Transistor (FET) may include a semiconductor substrate having a first conductivity type, a semiconductor layer of the first conductivity type formed over the substrate, and a pair of doped bodies of a second conductivity type opposite the first conductivity type formed in the semiconductor layer. A trench filled with a trench dielectric is formed within a region between the doped bodies. The FET may be a Vertical Metal-Oxide-Semiconductor FET (VMOSFET) including a gate dielectric disposed over the region between the doped bodies and the trench, and a gate electrode disposed over the gate dielectric, wherein the trench operates to prevent breakdown of the gate dielectric, or the FET may be a Junction FET. The FET may be designed to operate at radio frequencies or under heavy-ion bombardment. The semiconductor substrate and the semiconductor layer may comprise a wide band-gap semiconductor such as silicon carbide.

24 Claims, 12 Drawing Sheets

(56) References Cited

U.S. PATENT DOCUMENTS

2014/0367771 A1* 12/2014 Chatty .............. H01L 29/66719
　　　　　　　　　　　　　　　　　　　　　　257/329
2018/0175188 A1*  6/2018 Banerjee ............ H01L 29/0869

OTHER PUBLICATIONS

Han, Kijeong; Split-Gate 1.2-kV 4H-SiC MOSFET: Analysis and Experimental Validation; IEEE Electron Device Letters; Oct. 2017; pp. 1437-1440; vol. 38, No. 10.

Han, Kijeong; A Novel 1.2 kV 4H-SiC Buffered-Gate (BG) MOSFET: Analysis and Experimental Results; IEEE Electron Device Letters; Feb. 2018; pp. 248-251; vol. 39, No. 2.

Ni, Weijiang; Comparative Study of SiC Planar MOSFETs With Different p-Body Designs; IEEE Transactions On Electron Devices; Mar. 2020; pp. 1071-1076; vol. 67, No. 3.

Vudumula, Pavan; Design and Optimization of 1.2-kV SiC Planar Inversion MOSFET Using Split Dummy Gate Concept for High-Frequency Applications; IEEE Transactions On Electron Devices; Dec. 2019; pp. 5266-5271; vol. 66, No. 12.

Zhang, Qingchun (Jon); Latest Results on 1200 V 4H-SiC CIMOSFETs with Rsp,on of 3.9 mΩ-cm2 at 150C; Proceedings of the 27th International Symposium on Power Semiconductor Devices & IC's; May 10-14, 2015, pp. 89-92; Kowloon Shangri-La, Hong Kong.

* cited by examiner

Continue to: Embodiment 1A

RF SIC MOSFET WITH RECESSED GATE DIELECTRIC

BACKGROUND

In a planar technology for vertical power transistors, such as a Vertical Metal-Oxide-Semiconductor Field Effect Transistor (VMOSFET) or a Vertical Insulated Gate Bipolar Transistor (VIGBT), the channel is formed along the surface of the semiconductor wafer, and the drift region includes the semiconductor region located between the bodies that surround the source regions of the MOSFET or IGBT. This semiconductor region between the body regions is commonly called Junction Field Effect Transistor (JFET) region, though the vertical transistor does not operate in JFET mode. In an n-channel VMOSFET or VIGBT, the body regions are p-type (commonly called P-wells) and the JFET region is n-type.

In some such transistors, such as Silicon Carbide (SiC) VMOSFETs, the center of the JFET region is a weak point for the long-term reliability of the gate dielectric. Accordingly, the design of the VMOSFET should provide adequate shielding of the electric field near the interface between the JFET region and the gate dielectric.

In a Radio-Frequency (RF) VMOSFET designed for high-frequency operation, a wide gate pitch is typically required to allow a gate metal to be placed on the polysilicon gate. As a result, the gate-to-drain capacitance Cm, the gate-to-source capacitance CGs, or both may be increased (relative to devices with narrower gate pitches), which increases the charge required to commute the VMOSFET, and degrades its high-frequency performance.

Under heavy-ion bombardment in outer space, one of the most frequent failure mode of VMOSFETs or VIGBTs is the Single Event Gate Rupture (SEGR). This failure mode may occur when a heavy-ion-induced charge modulates the conductivity of the drift layer, causing the applied voltage on the backside of the device to appear at the interface between the semiconductor drift region and the gate dielectric. In these conditions, dielectric breakdown of the gate dielectric could easily occur, resulting in irreversible damage to the device. The reliability of VMOSFETs and VIGBTs under harsh space conditions could be greatly improved with a gate dielectric design which can withstand the operating drain voltage.

It would be advantageous to be able to protect the interface between the gate dielectric and the JFET region of a VMOSFET, especially for VMOSFETs with a wide gate pitch designed for high-frequency operation or for VMOSFETs designed to operate under heavy-ion bombardment.

SUMMARY OF THE INVENTION

Embodiments relate to semiconductor devices and manufacturing processes thereof, and in particular to VMOSFETs designed with a wide gate pitch.

In an embodiment, a semiconductor device comprises a semiconductor substrate having a first conductivity type, a semiconductor layer formed over the substrate and having the first conductivity type, and a pair of doped bodies formed in the semiconductor layer and having a second conductivity type opposite the first conductivity type. A trench is disposed within a region between the doped bodies, and a trench dielectric disposed within the trench. A gate dielectric is disposed over the region between the doped bodies and over the trench. A gate electrode is disposed over the gate dielectric.

In embodiments, the semiconductor device is a silicon carbide vertical MOSFET designed to operate at radio frequencies.

In embodiments, the semiconductor device is a silicon carbide vertical MOSFET designed to operate under heavy-ion bombardment.

In an embodiment, a method of manufacturing a semiconductor device comprises forming a semiconductor layer of a first conductivity type on a semiconductor substrate of the first semiconductor type, forming a pair of doped bodies having a second conductivity type opposite the first conductivity type in the semiconductor layer, forming a trench in a region between the doped bodies, and forming a trench dielectric within the trench. The method further comprises forming a gate dielectric over the region between the doped bodies, including forming the gate dielectric over the trench, and forming a gate electrode over the gate dielectric.

DETAILED DESCRIPTION

Figure 1A:
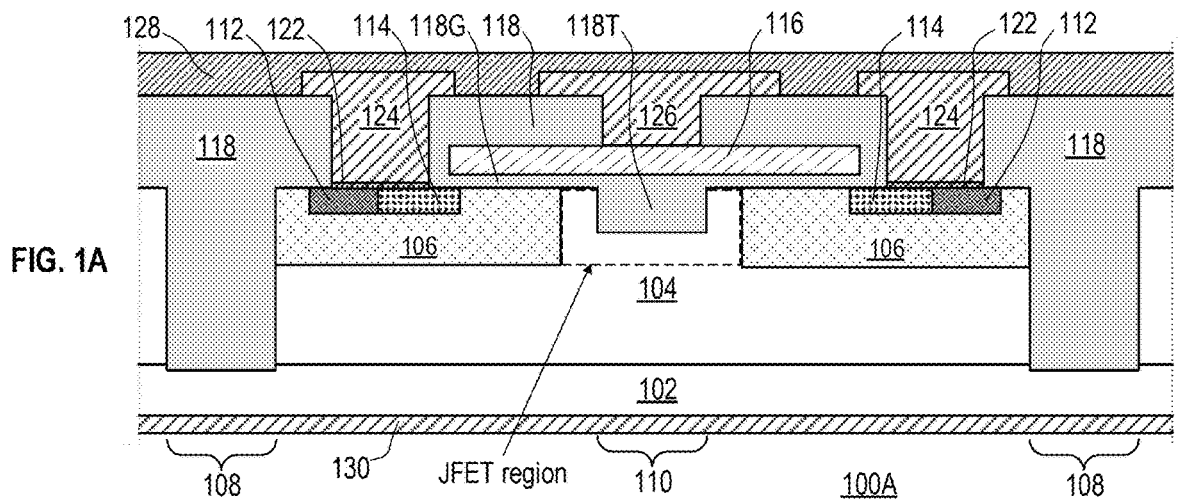
FIGS. 1A through 1G illustrate VMOSFETs according to respective embodiments.

Embodiments of the present application relate to transistors having gate dielectrics, such as VMOSFETs. In embodiments, a central portion of a JFET region of an epitaxial layer is adapted to protect the gate dielectric and comprises a trench having an insulating material disposed therein. The interface between the trench and the epitaxial layer may be prepared by the formation of a sacrificial oxide or a liner oxide before the insulating material is formed in the trench, or the portion of the JFET region may be oppositely-doped (relative to the rest of the JFET region) before the trench is formed.

As used herein, a JFET region of a VMOSFET may refer to a region of epitaxial silicon disposed under the gate dielectric and between the bodies (e.g., the P-bodies of an n-channel VMOSFET) of the VMOSFET. The JFET region is part of the drain drift layer of the VMOSFET.

In some MOSFETs, including silicon carbide (SiC) VMOSFETs, the center of the JFET region is a weak point for the long-term reliability of the gate dielectric. Accordingly, the design of such MOSFETs should provide adequate shielding of the electric field near the interface between the JFET region and the gate dielectric.

In SiC MOSFETs of the related arts, a very narrow JFET region ensures a strong shielding of the electric field. Furthermore, the gate pitch may be made as small as possible to lower the on-state resistance $R_{DS,ON}$ and the output capacitance $C_{OSS}$ of the MOSFET. However, the drawback of this approach is narrow gate electrodes and a high gate equivalent series resistance ESR, which is highly detrimental for RF applications.

Furthermore, in RF MOSFETs, process constraints in the patterning of metal lines may impose a wide pitch on the metal gate electrodes. As a result, the area of the junction between the gate electrodes and the JFET region of the RF MOSFET may be large, which increases the output capacitance $C_{OSS}$ and the reverse capacitance $C_{RSS}$ of the RF MOSFET, degrading its performance under high-frequency operation.

Accordingly, embodiments include a VMOSFET comprising a wide JFET region, and a trench formed in the middle of the JFET region. The trench is filled with a dielectric, like silicon dioxide ($SiO_2$) or un-doped polysilicon, and protects the weak spot for long-term reliability at the center of the JFET region. The trench also helps with the breakdown voltage and its contribution to the reverse transfer capacitance $C_{RSS}$ of the VMOSFET is small and usually negligible.

A shallow trench in the JFET region (for example, a 0.5 micron (μall) deep trench) provides significant benefits. But higher performances may be achieved with deeper trenches, such as a trench having a depth greater than the depth of the metallurgical junction between the bodies of the VMOSFET and the epitaxy layer, or, in a preferred embodiment, a trench through the entire thickness of the epitaxy layer.

In this document, any trench deeper than the JFET region (that is, deeper than a metallurgical junction between the bodies of the VMOSFET and the epitaxy layer) may be referred to as a deep trench. Such a trench may be formed, in some embodiments, using process steps that have been developed for trench MOSFETs technology. In contrast to a planar MOSFET technology where the channel is formed along the surface of the semiconductor wafer, the channel is formed along the side-wall of the trench in a trench MOSFETs technology.

The reverse transfer capacitance $C_{RSS}$ and the electric field across the gate dielectric could be further reduced with the formation of a raised oxide on top of the trench.

The quality of the interface between the trench and the surrounding semiconductor has a substantial impact on the effectiveness of the trench.

Accordingly, in some embodiment, a sacrificial oxide may be formed and removed prior to the dielectric fill of the trench to reduce the density of crystal defects and traps at the semiconductor surface.

In other embodiments, a liner oxide with nitrogen passivation may be formed as a lining of the trench before the trench is filled.

In still other embodiments, a portion of the JFET region within which the trench is to be formed may be first doped contrary to the doping of the JFET region, that is, if the JFET region is a n-type material, dopants may be added (for example, implanted) into the portion of the JFET region within which the trench is to be formed to convert it to a p-type material. The trench is then formed in the contra-doped material within the JFET region.

A detailed description of embodiments is provided below along with accompanying figures. The scope of this disclosure is limited only by the claims and encompasses numerous alternatives, modifications, and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Embodiments are described in terms of n-channel SiC VMOSFETs, but embodiments are not limited thereto, and may include p-channel devices, devices formed of semiconductors other than SiC (such as silicon, gallium nitride (GaN), aluminum gallium nitride (AlGaN), high aluminum content AlGaN, beta gallium trioxide ($\beta$-$Ga_2O_3$), diamond, boron nitrides, and the like), and devices other than VMOSFETs, such as VIGBTs or VJFETs.

FIGS. 1A through 1G illustrate, in simplified fashion, n-channel SiC VMOSFETs 100A through 100G according to respective embodiments. In FIGS. 1A through 1G, like reference characters refer to like features, and descriptions thereof will not be repeated in the interest of brevity.

FIG. 1A illustrates a VMOSFET 100A according to an embodiment. The VMOSFET 100A comprises a substrate 102 of a semiconductor material on which an epitaxial layer (hereinafter, the epitaxy 104) has been formed. The epitaxy 104 may be grown on the substrate 102. The substrate 102 may be of the same semiconductor material and the same conductivity type as the epitaxy 104 but may be more heavily doped (and therefore may have a higher conductance) than the epitaxy 104.

In embodiments, the substrate 102 and epitaxy 104 may include a wide bandgap semiconductor such as SiC, and may be n-type material, but embodiments are not limited thereto. For example, in embodiments, the substrate 102 and epitaxy 104 may include silicon or GaN. In other embodiments, the substrate 102 and epitaxy 104 may be p-type material.

P-bodies 106 are formed in the epitaxy 104 in an area surrounded by deep trenches 108. A shallow region 112 of heavily doped p-type material and a source region 114 of heavily doped n-type material are formed in each of the P-bodies 106. The purpose of the regions 112 is to provide an electrical connection to the P-bodies 106 with a low contact resistance by increasing the doping concentration near the surface of the semiconductor.

The region of the epitaxy 104 between the P-bodies 106 corresponds to a JFET region having the same conductivity type (here, n-type) as the epitaxy 104. In some embodiments, the JFET region may have a substantially higher doping concentration than the epitaxy 104 to minimize its contribution to the drift resistance.

A shallow under-gate trench 110 is formed spanning the center of the JFET region of the epitaxy 104. A sacrificial oxide layer (not shown) may have been formed over the surfaces of the shallow under-gate trench 110 to improve the quality of thereof and may have been removed by subsequent processing.

The deep trenches 108 are filled with a dielectric 118. The dielectric 118 is also disposed over the top of the epitaxy 104 (including over the JFET region) and the doped regions 106.

In embodiments, portions of the dielectric 118 disposed over the JFET region and the P-bodies 106 may comprise a gate dielectric 118G. In other embodiments, the gate dielectric 118G is a different material than the dielectric 118.

In embodiments, a portion of the dielectric 118 may be disposed in the shallow under-gate trench 110 to form the shallow trench dielectric 118T. In other embodiments, the shallow trench dielectric 118T is a different material than the dielectric 118.

In an embodiment, one or more of the dielectric 118, the gate dielectric 118G, or the shallow trench dielectric 118T includes silicon dioxide ($SiO_2$). In an embodiment, the dielectric 118 includes borophosphosilicate glass (BPSG).

In an embodiment, one or more of the dielectric 118, the gate dielectric 118G, or the shallow trench dielectric 118T includes BoroPhosphoSilcate Glass (BPSG).

In an embodiment, one or more of the dielectric 118, the gate dielectric 118G, or the shallow trench dielectric 118T includes a material with low dielectric permittivity ("low-k" material), such as but not limited to BenzoCycloButene (BCB).

A gate electrode 116 is formed above the gate dielectric 118G and overlapping portions of the P-bodies 106 and portions of the source regions 114. In embodiments, the gate electrode 116 may comprise polysilicon.

Source contacts 124 are formed over and in electrical contact with the regions 112 and the source regions 114. The source electrodes 124 may comprise aluminum, among other conductors, and may be electrically connected to their respective regions 112 and source regions 114 by respective silicide layers 122. In an embodiment, the silicide layers 122 may comprise nickel silicide, or may be a silicide of another metal capable of forming an ohmic contact with both p-type and n-type SiC.

A gate contact 126 is formed over and in electrical contact with the gate electrode 116. The gate contact 126 may comprise aluminum, among other conductors. In embodiments, the gate contact 126 and gate electrode 116 form a metalized gate comprising doped polysilicon with a continuous metal layer formed thereon to improve the electrical conductivity.

A passivation layer 128 is formed over the dielectric 118, source contacts 124, and gate contact 126. In an embodiment, the passivation layer 128 may include silicon oxynitride (SiON).

A drain contact 130 comprising a conductor, such as silver, is formed over and electrically connected to a bottom surface of the substrate 102. In an embodiment, the drain contact 130 is electrically connected to the substrate 102 using a silicide layer (not shown) formed over the bottom surface of the substrate 102. In an embodiment, the silicide layer formed over the bottom surface of the substrate 102 may comprise nickel silicide.

The under-gate trench 110 operates both to decrease the gate-to-drain capacitance CGS (by decreasing the area of the portion of the gate electrode 116 that is in close proximity to the JFET region) and to ensure a low electric field in the dielectric layer 118T, including near the center of the JFET region.

Accordingly, by forming the under-gate trench 110 filled (in this embodiment) with a dielectric in the center of the JFET region, the gate pitch (described below with respect to FIGS. 2A and 2B) can be increased without affecting the reverse transfer capacitance $C_{RSS}$ or the output capacitance $C_{OSS}$ of the VMOSFET 100A and without an adverse impact on the long term reliability of the VMOSFET 100A that may be caused by the rupture of the gate dielectric under a high electric field stress at the center of the JFET region.

For advanced SiC VMOSFET designs, the gate pitch is determined by the process capability of a foundry through the dimension control of some critical layers, such the gap between the P-bodies, the overlap between the P-bodies and the polysilicon gate, the separation between the polysilicon gate and the source contact, and the width of the source and gate contacts. In state-of-the-art foundries, SiC VMOSFETs with gate pitches below 6.0 µm can be manufactured in high volume without any adverse effects on the yield.

The metal lines for the source and gate connections should be thick enough (at least 0.8 µm thick) to carry high current densities without adverse effects on the long-term reliability, such as electromigration or thermally-induced failures. In state-of-the-art foundries, these thick metal lines have a minimum width of approximately 2.5 µm and a minimum separation of approximately 1.0 µm. As a result, the pitch required to design a source and a gate metal connections side-by-side is approximately 7.0 µm. Hence, SiC VMOSFET design for low-frequency switching should be modified to be compatible with the design requirements for RF applications. To increase the pitch without degrading the output capacitance $C_{OSS}$ (and the switching performance of the MOSFET), the main knob available is the width of the JFET region. However, the shielding of electric field near the center of a wider JFET region gets weaker which leads to serious reliability concerns. For a modern SiC technology, the long-term reliability of a VMOSFET with a standard gate design cannot be guaranteed if the width of the JFET region is greater than 1.6 µm.

For example, in embodiments, a gate pitch can be equal or greater than 7.0 µm, a width of the gate electrode 116 can be equal or higher than 2.5 µm, and the width of the under-gate trench 110 may be equal or greater than 0.8 µm, all measured in the horizontal direction of FIG. 1A.

Figure 1B:
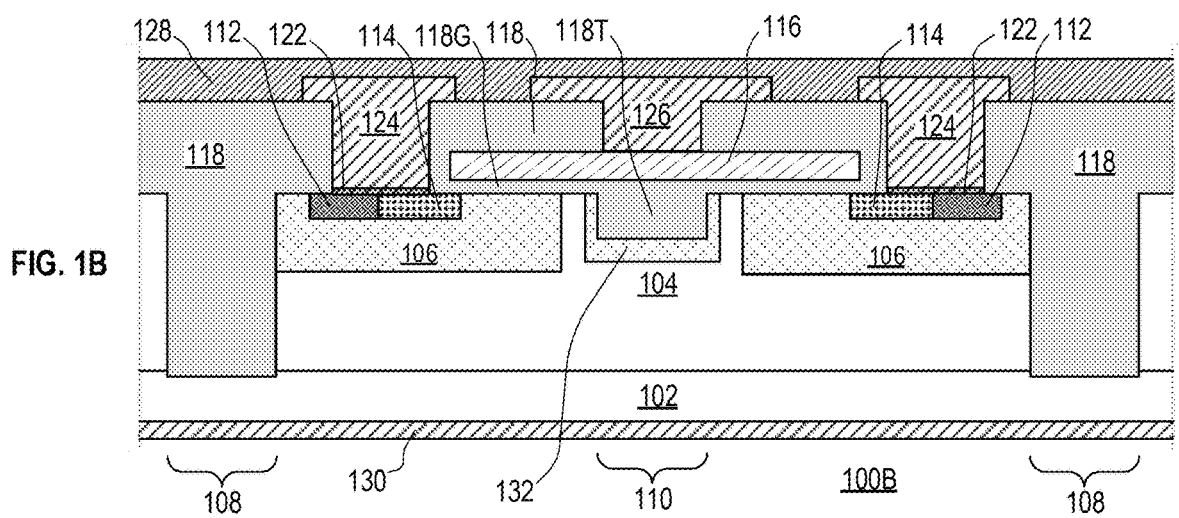

FIG. 1B illustrates a VMOSFET 100B according to another embodiment.

The VMOSFET 100B differs from the VMOSFET 100A of FIG. 1A in that the under-gate trench 110 of VMOSFET 100B is formed in a P-well 132 comprising a p-type material. In an embodiment, the bottom of the P-well 132 is at least as deep as the bottom of the P-bodies 106. In an embodiment, the P-well 132 is electrically connected to the P-doped region 112.

The P-well 132 obviates the need to form the sacrificial oxide described (but not shown) with respect to FIG. 1A by eliminating the need for high-quality interfaces between the under-gate trench 110 and the surrounding epitaxy 104.

The under-gate trench 110 formed in the P-well 132 provides the advantages described with respect to FIG. 1A.

Figure 1C:
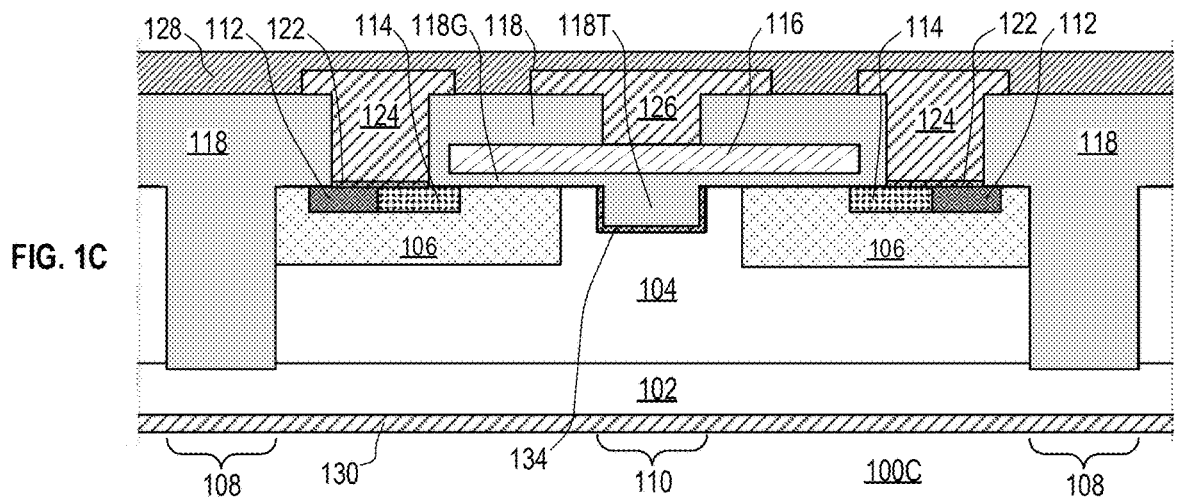

FIG. 1C illustrates a VMOSFET 100C according to another embodiment.

The VMOSFET 100C differs from the VMOSFET 100A of FIG. 1A in that a liner oxide 134 is formed on the surfaces of the under-gate trench 110 of VMOSFET 100C before the under-gate trench 110 is filled with the dielectric 118T. In embodiments, the liner oxide 134 comprises silicon dioxide ($SiO_2$) with nitrogen content to passivate the traps at the interface with the semiconductor.

Higher interface quality between the under-gate trench 110 and the surrounding epitaxy 104 can be obtained if the liner oxide 134 is applied in conjunction with the sacrificial oxide described (but not shown) with respect to FIG. 1A. In a first step the sacrificial oxide is formed and removed and in a second step the liner oxide is formed.

The under-gate trench 110 including the liner oxide 134 provides the advantages described with respect to FIG. 1A.

Figure 1D:
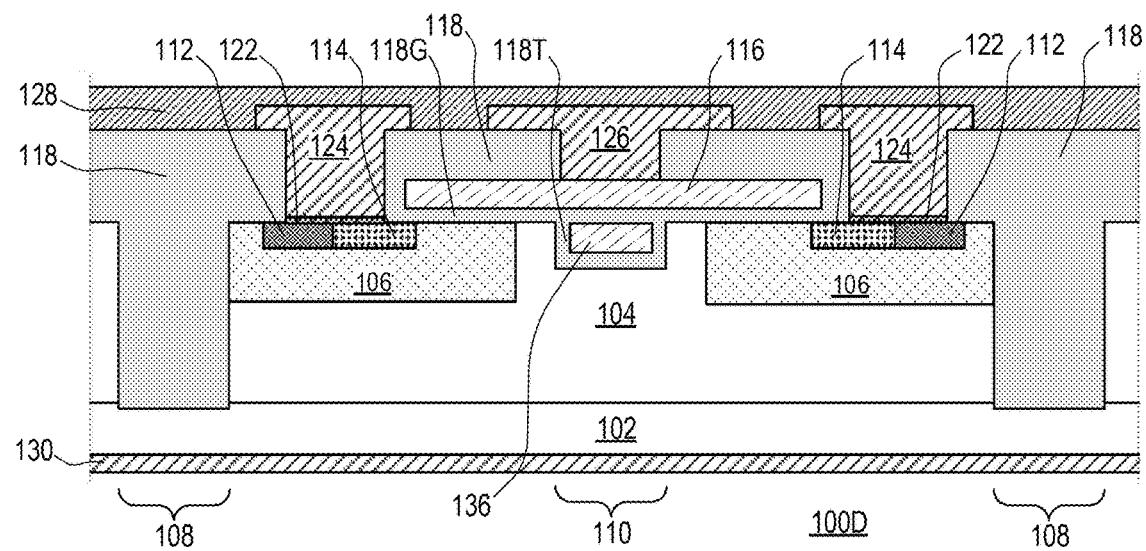

FIG. 1D illustrates a VMOSFET 100D according to another embodiment.

The VMOSFET 100D differs from the VMOSFET 100A of FIG. 1A in that the under-gate trench 110 includes a polysilicon fill 136 surrounded by the trench dielectric 118T. The under-gate trench 110 may have a high-quality interface with the epitaxy 104 formed using a sacrificial oxide, as described with respect to FIG. 1A, or a liner oxide, as described with respect to FIG. 1C.

In another embodiment, the under-gate trench 110 may be formed in a P-well as described with respect to FIG. 1B.

In another embodiment, the polysilicon 136 may be un-doped.

The under-gate trench 110 including the polysilicon fill 136 provides the advantages described with respect to FIG. 1A and may be formed with the same process steps as those implemented in a VMOSFET trench technology (channel formed along the side-wall of the trench), as is widely known in the art.

Figure 1E:
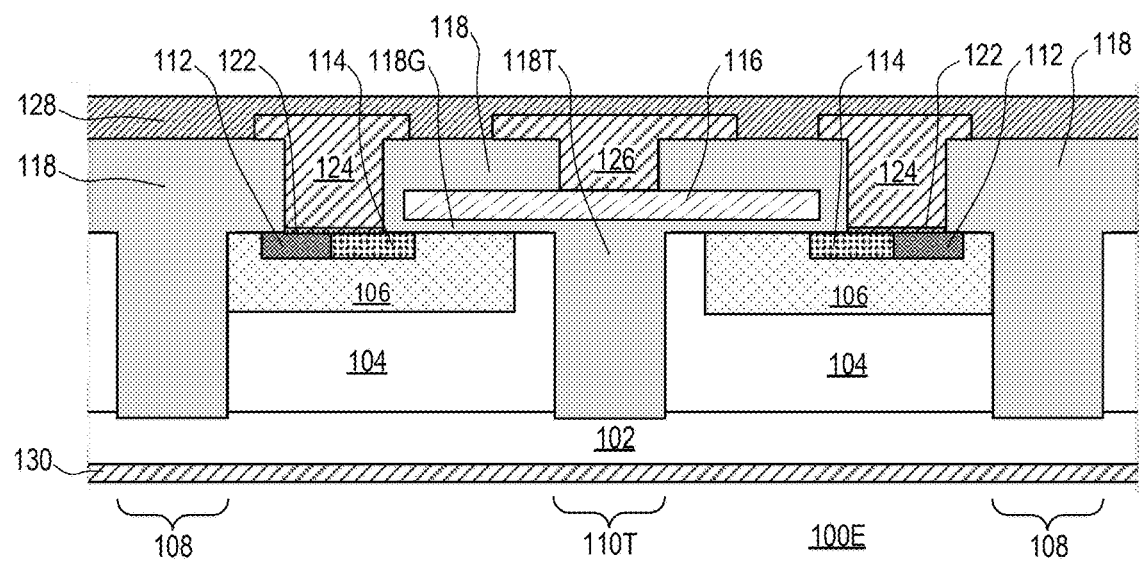

FIG. 1E illustrates a VMOSFET 100E according to another embodiment.

The VMOSFET 100E differs from the VMOSFET 100A of FIG. 1A in that a deep under-gate trench 110T is used instead of the shallow under-gate trench 110 of FIG. 1A. In particular, the deep under-gate trench 110T has a bottom that is at least as deep as the metallurgical junction between the bottom of the P-bodies 106 and the epitaxy 104. In the embodiment shown in FIG. 1E, the deep under-gate trench 110T penetrates the entirety of the epitaxy 104 and part way into the substrate 102.

The deep under-gate trench 110T may have a high-quality interface with the epitaxy 104 formed using a sacrificial oxide, as described with respect to FIG. 1A, or a liner oxide, as described with respect to FIG. 1C.

The deep under-gate trench 110T provides at least the advantages described with respect to FIG. 1A.

The deep under-gate trench 110T may further reduce the gate-to-drain capacitance $C_{GD}$ of the VMOSFET 100E, while reducing the electric field in the trench dielectric fill 118T.

Figure 1F:
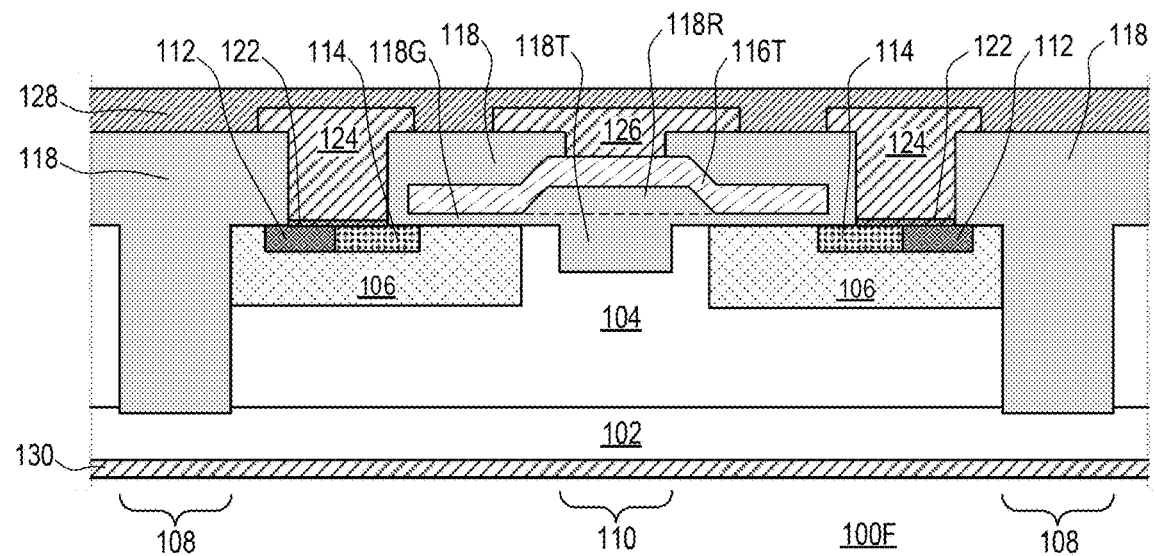

FIG. 1F illustrates a VMOSFET 100F according to another embodiment.

The VMOSFET 100F differs from the VMOSFET 100A of FIG. 1A in that a raised oxide 118R is formed above the under-gate trench 110. The raised oxide 118R may be part of the gate dielectric 118G.

The gate electrode 116T is formed over the gate dielectric 118G and the raised oxide 118R.

The raised oxide 118R may further reduce the gate-to-drain capacitance $C_{GD}$ of the VMOSFET 100F, while reducing the electric field in the trench dielectric fill 118T near the center of the JFET region.

The under-gate trench 110 having the raised oxide 118R formed above it provides at least the advantages described with respect to FIG. 1A.

The raised oxide provides the same additional benefits as described for the deep trench of FIG. 1E using a process of lesser complexity.

Figure 1G:
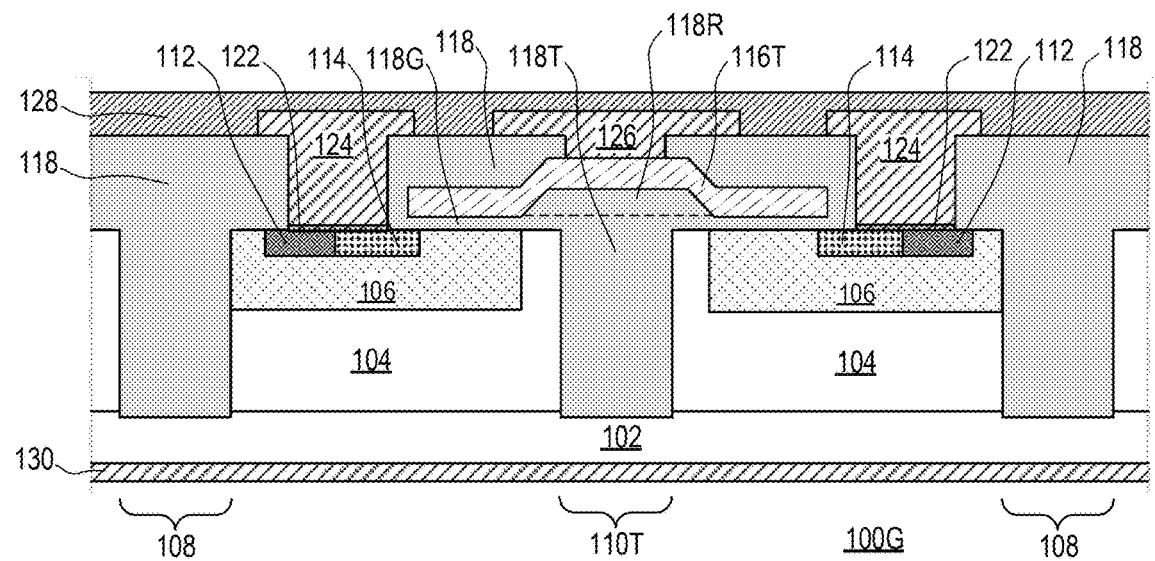

FIG. 1G illustrates a VMOSFET 100G according to another embodiment.

The VMOSFET 100G differs from the VMOSFET 100E of FIG. 1E in that a raised oxide 118R is formed above the deep under-gate trench 110T. The raised oxide 118R may be part of the gate dielectric 118G.

The gate electrode 116T is formed over the gate dielectric 118G and the raised oxide 118R.

The raised oxide 118R may further reduce the gate-to-drain capacitance Cm of the VMOSFET 100G, while reducing the electric field in the trench dielectric fill 118T near the center of the JFET region.

The deep under-gate trench 110T having the raised oxide 118R formed above it provides at least the advantages described with respect to FIG. 1A.

Figure 2A:
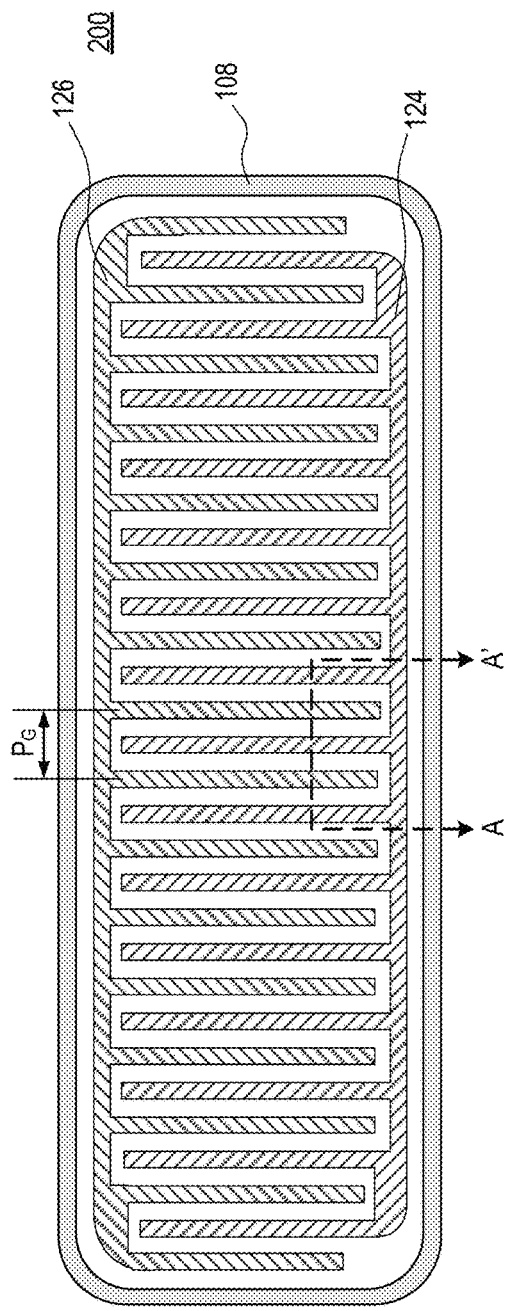
FIGS. 2A and 2B illustrate a VMOSFET according to another embodiment.
Figure 2B:
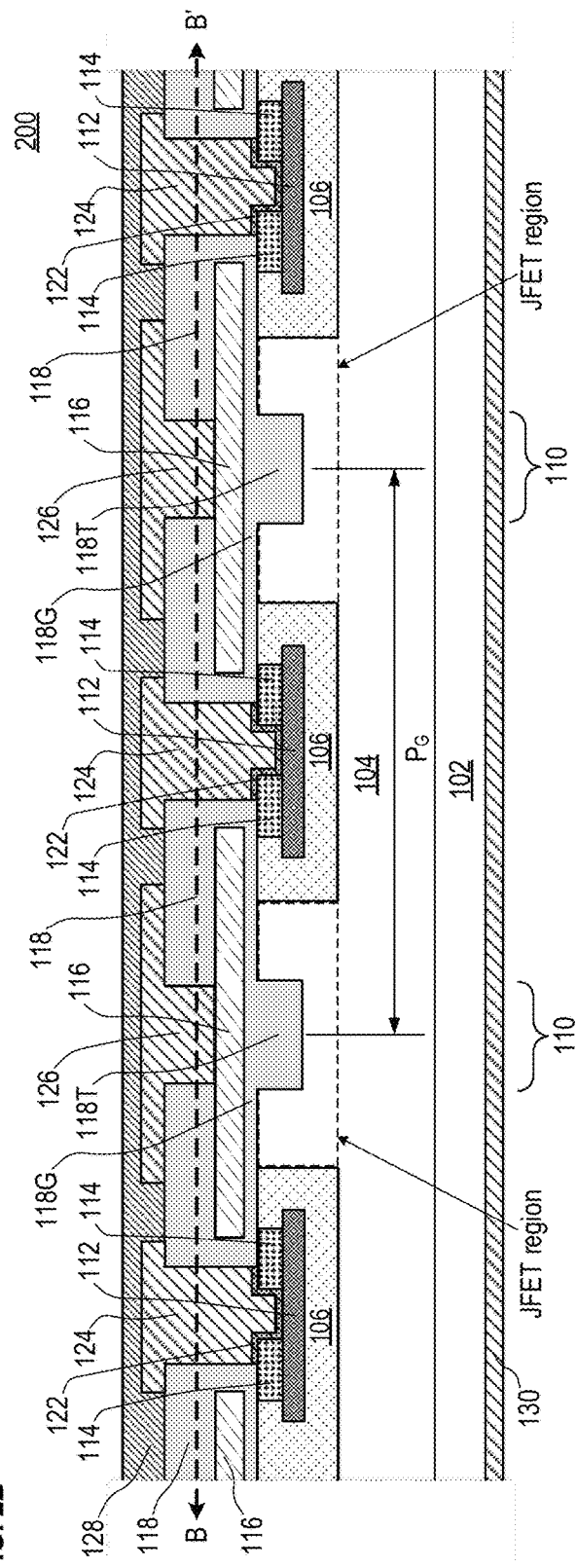

FIGS. 2A and 2B illustrate a VMOSFET 200 according to an embodiment. The VMOSFET 200 is a multi-finger VMOSFET based on the innovations disclosed with respect to VMOSFET 100A of FIG. 1A, but embodiments are not limited thereto, and multi-finger VMOSFETs according to embodiments could be based on the innovations disclosed with respect to any one of VMOSFET 100A through VMOSFET 100G, or combinations thereof.

FIG. 2A is a plan view along the plane indicated by the line B-B' in FIG. 2B. FIG. 2B is a cross section taken along line A-A' in FIG. 2A. Like reference characters in FIGS. 2A and 2B indicate structures similar to the structures associated with those reference characters in FIGS. 1A through 1G.

FIG. 2A shows the VMOSFET 200 including a source contact 124 and a gate contact 126. A deep trench 108 is disposed around the periphery of the VMOSFET 200.

The gate contact 126 includes a plurality of fingers. The source contact 124 includes a plurality of fingers inter-digitated with the plurality of fingers of the gate contact 126. A center-to-center spacing between the fingers of the gate contact 126 corresponds to a gate pitch PG.

As shown in FIG. 2B, the VMOSFET 200 differs from the VMOSFET 100A in having a plurality of JFET regions and a plurality of corresponding structures (gate electrodes 116, trenches 110, P-bodies 106, and so on) for each JFET region.

Furthermore, the highly-doped regions 112 in the P-bodies 106 are disposed beneath the source regions 114 thereof, and a center portion of each source region 114 is removed to allow the source contacts 124 to electrically connect to the regions 112 (here, through the silicide layer 122).

FIGS. 3A through 7C illustrate semiconductor device manufacturing process steps according to various embodiments. Like reference characters in FIGS. 3A through 7C refer to similar structures in FIGS. 1A through 1G. While the steps are shown in a particular order, embodiments are not limited thereto. Where techniques for creating a structure shown in FIGS. 3A through 7C are well-known in the related arts (for example, the forming of layers by deposition followed by photolithography), descriptions of the techniques are omitted in the interest of brevity.

FIGS. 3A through 3G illustrate semiconductor device manufacturing process steps according to an embodiment.

Figure 3A:
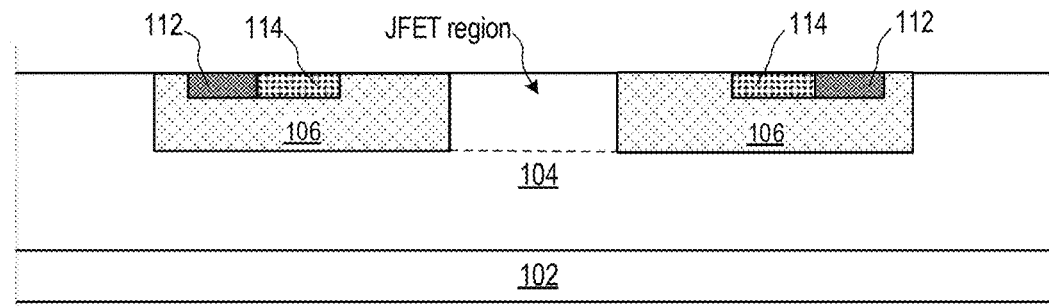
FIGS. 3A through 3G illustrate steps in a semiconductor device manufacturing process according to an embodiment.

FIG. 3A shows a semiconductor device including a substrate 102, an epitaxy 104, and P-bodies 106. A source region 114 and a highly doped region 112 are disposed in each of the P-bodies 106. A JFET region corresponds to a portion of the epitaxy 104 disposed between the P-bodies 106. In embodiments, the JFET region may have a higher doping concentration than other portions of the epitaxy 104.

Figure 3B:
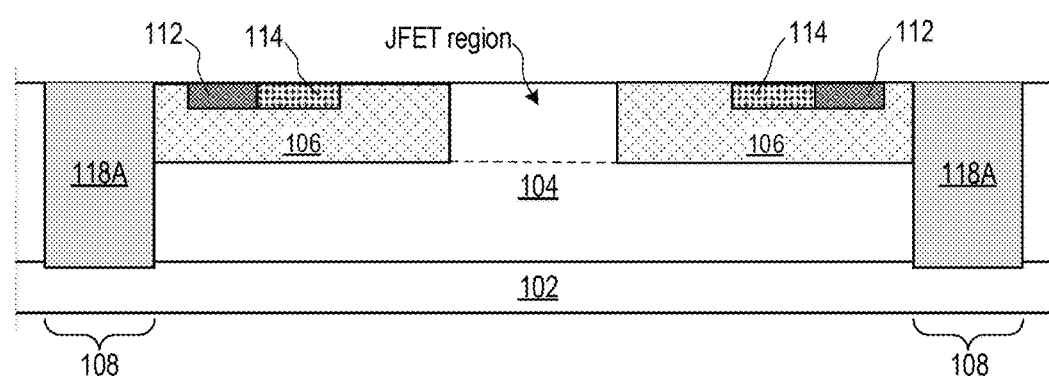

In FIG. 3B, deep trenches 108 have been etched through the epitaxy 104 and filled with a dielectric 118A. In the embodiment of FIG. 3B, the deep trenches 108 penetrate into the substrate 102. A portion of the P-bodies 106 was removed when the deep trenches 108 were formed.

Figure 3C:
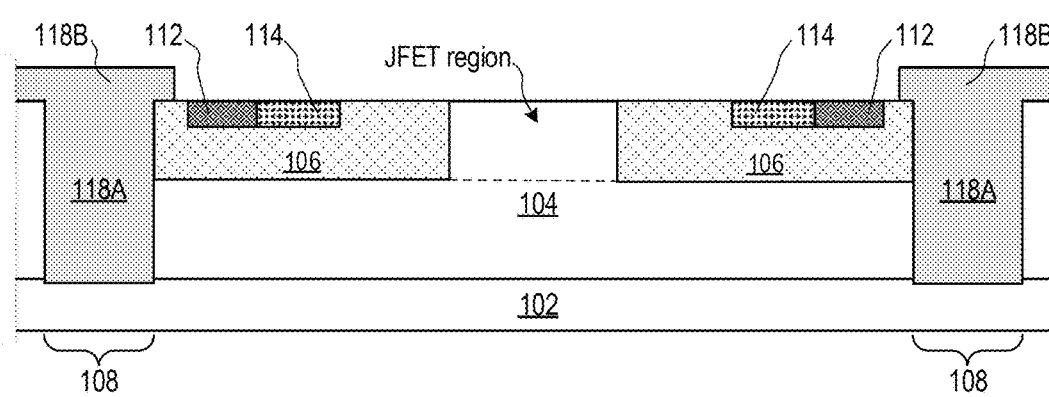

In FIG. 3C, a dielectric layer 118B has been formed over the deep trenches 108, portions of the epitaxy 104 outside the trenches, and a portion of the P-bodies 106. The dielectric layer 118B may be formed by depositing a dielectric material over the top surface of the device and etching the dielectric material to expose the P-bodies 106, source regions 114, highly doped regions 112, and the portion of the epitaxy 104 between the P-bodies 106 (i.e., the JFET region).

Figure 3D:
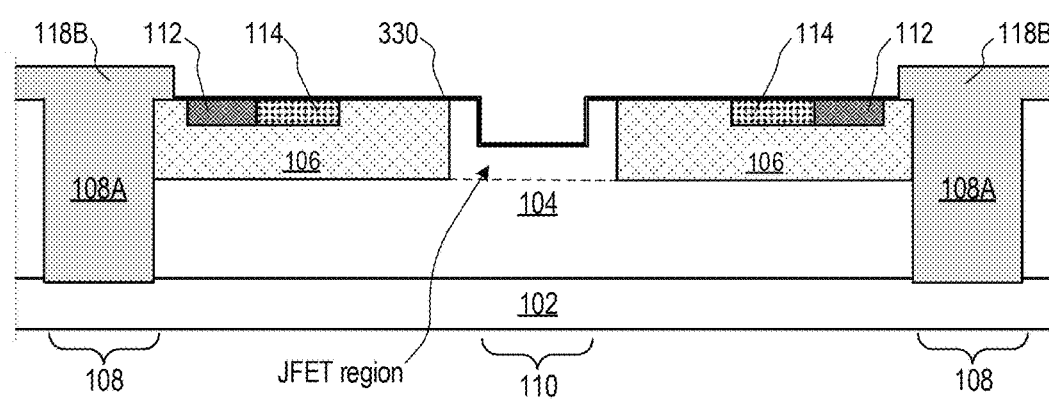

In FIG. 3D, a shallow under-gate trench 110 has been formed in the JFET region of the epitaxy 104. A sacrificial oxide 330 has been grown over surfaces of the under-gate trench 110 to improve the quality of the semiconductor crystal near those surfaces. In an embodiment, the sacrificial oxide 330 comprises silicon dioxide ($SiO_2$) formed by thermal oxidation.

In the embodiment shown, the sacrificial oxide 330 is also formed over top surfaces of the device outside the under-gate trench 110, but embodiments are not limited thereto.

Figure 3E:
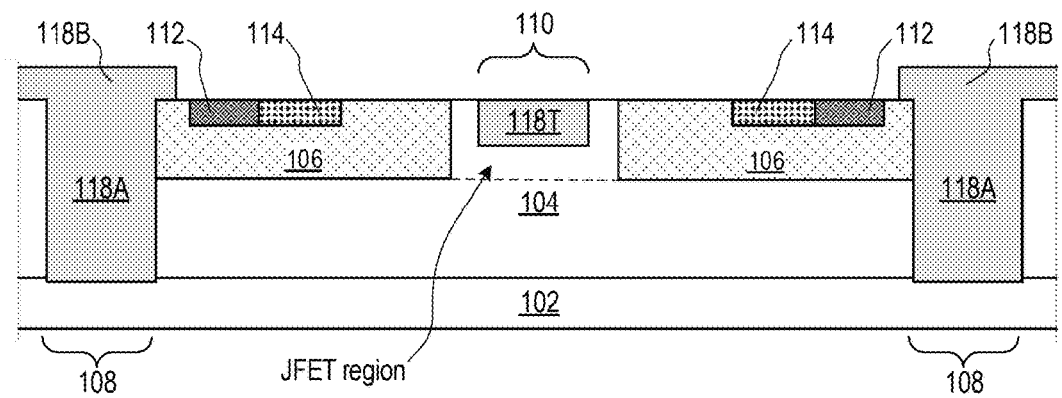

In FIG. 3E, the sacrificial oxide 330 has been stripped off. After the sacrificial oxide 330 was removed, the under-gate trench 110 was filled with a trench dielectric 118T.

Figure 3F:
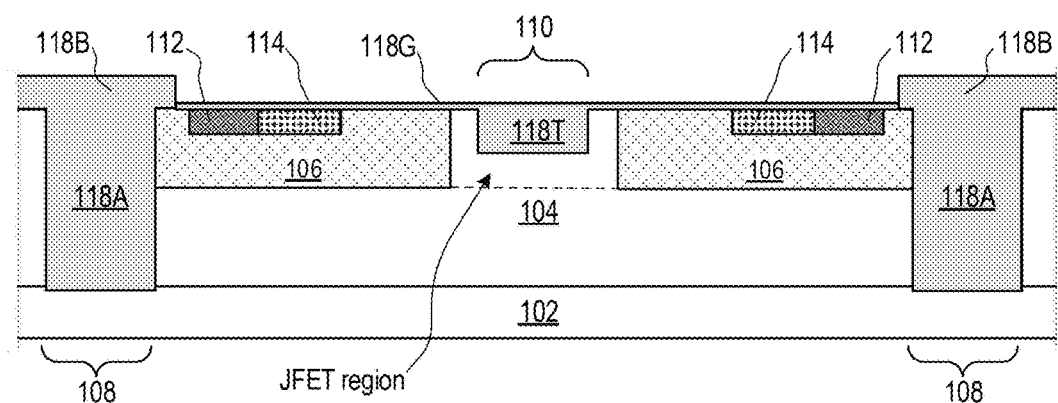

In FIG. 3F, a gate dielectric 118G has been formed over the JFET region, the under-gate trench 110, the exposed portions of the P-bodies 106, source regions 114, and highly doped regions 112.

Figure 3G:
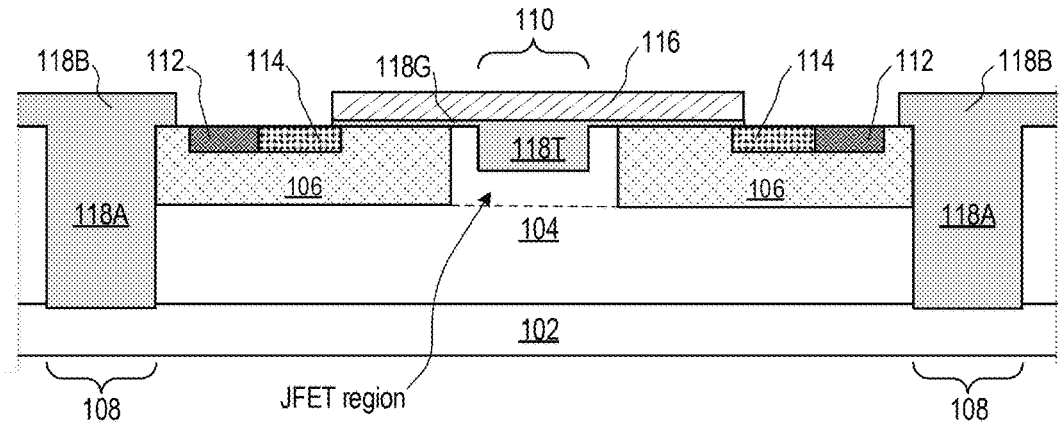

In FIG. 3G, a gate electrode 116 has been formed over the gate dielectric 118G and over portions of the source regions 114, the P-bodies 106, the JFET region, and the shallow under-gate trench 110. The portions of the gate dielectric 118G not covered by the gate electrode 116 have been removed. In an embodiment, the gate electrode 116 may comprise polysilicon.

Processing may then continue using techniques and materials disclosed herein and those known in the related arts to produce an embodiment such as, for example, the VMOSFET 100A of FIG. 1A.

FIGS. 4A through 4E illustrate steps in a semiconductor device manufacturing process according to another embodiment.

Figure 4A:
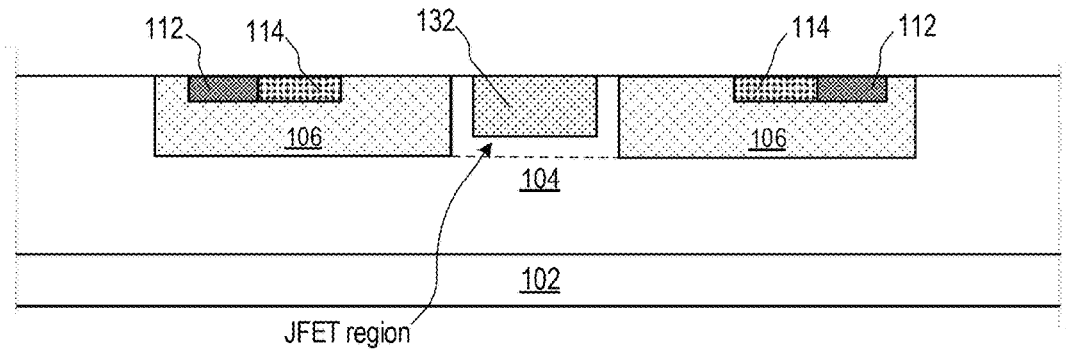
FIGS. 4A through 4E illustrate steps in a semiconductor device manufacturing process according to another embodiment.

FIG. 4A shows a semiconductor device including a substrate 102, an epitaxy 104, and P-bodies 106. A source region 114 and a highly doped region 112 are disposed in each of the P-bodies 106. A JFET region corresponds to a portion of the epitaxy 104 disposed between the P-bodies 106. In embodiments, the JFET region may have a higher doping concentration than other portions of the epitaxy 104.

A P-well 132 has been formed in the center of the JFET region by doping the epitaxy 104 of the JFET region, The doping of the P-well 132 may be performed by, for example, ion implantation of aluminum or another suitable doping elements. The doping of the P-well 132 gives the P-well 132 a conduction type opposite that of the JFET region of the epitaxy 104. For example, here where the JFET region comprises n-type material, the P-well 132 comprises p-type material.

Figure 4B:
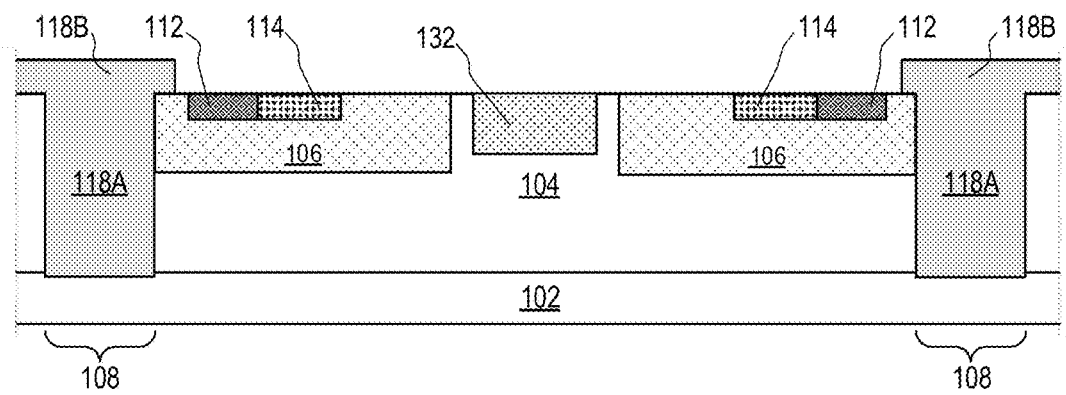

In FIG. 4B, deep trenches 108 have been etched through the epitaxy 104 and filled with a dielectric 118A. In the embodiment of FIG. 4B, the deep trenches 108 penetrate into the substrate 102. A portion of the P-bodies 106 was removed when the deep trenches 108 were formed.

A dielectric layer 118B has been formed over the deep trenches 108, portions of the epitaxy 104 outside the trenches, and a portion of the P-bodies 106. The dielectric layer 118B may be formed by depositing a dielectric material over the top surface of the device and etching the dielectric material to expose the P-bodies 106, the source regions 114, the highly doped regions 112, the P-well 132, and portions of the epitaxy 104 between the P-bodies 106 (i.e., the JFET region).

Figure 4C:
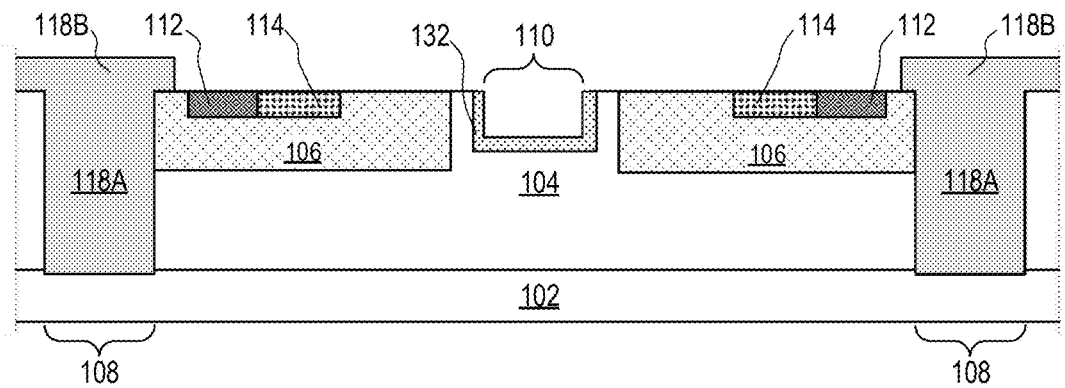

In FIG. 4C, a shallow under-gate trench 110 has been formed in the P-well 132.

Figure 4D:
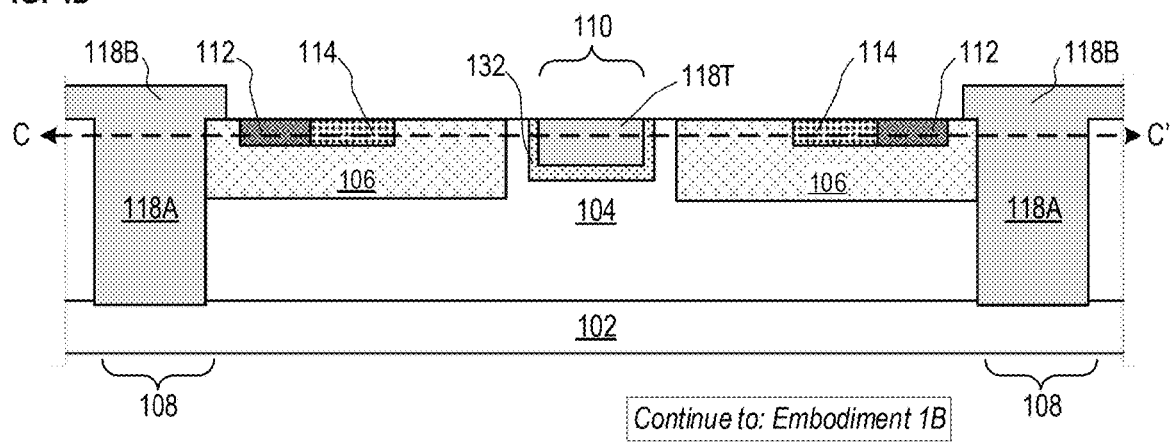

In FIG. 4D, the under-gate trench 110 has been filled with a trench dielectric 118T. Because the trench 110 is disposed in the P-well 132, there is no need to form and then remove a sacrificial oxide on surfaces of the trench 110 before filling the trench with the trench dielectric 118T.

Processing may then continue using techniques and materials disclosed herein and those known in the related arts to produce an embodiment such as the VMOSFET 100B of FIG. 1B.

Figure 4E:
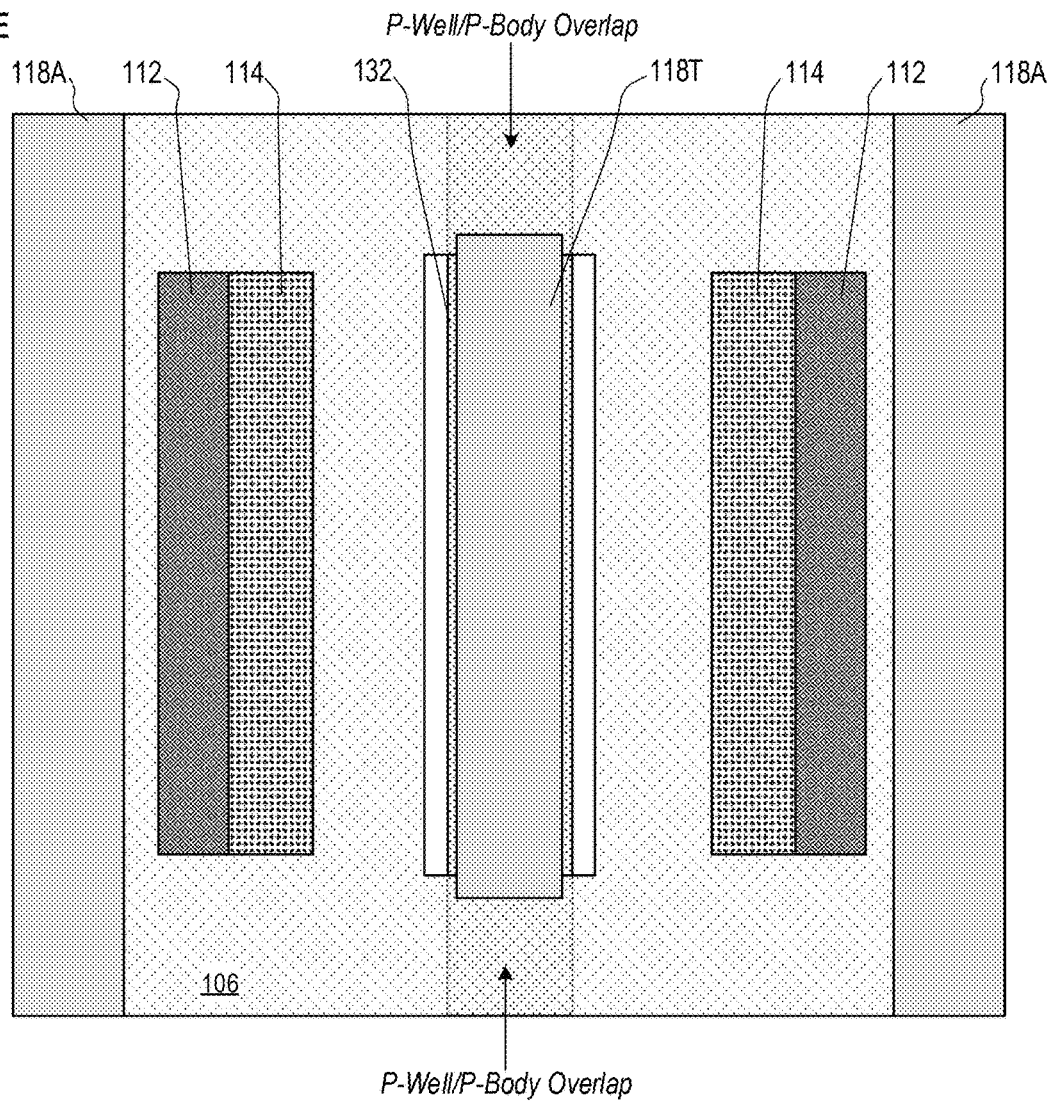

FIG. 4E is a plan view at the level of the line C-C' in FIG. 4D in accordance with an embodiment. As shown in FIG. 4E, the P-well 132 has a rectangular shape, The under-gate trench filled with the trench dielectric 118T is formed in the P-well 132. The P-well 132 extends beyond the ends of the under-gate trench and overlaps with the P-body 106, providing an electrical connection between the P-well 132 and the P-body 106.

In another embodiment, P-well 132 extends far enough beyond the JFET region to allow a plug to be used to connect the P-well 132 to an electrode, such as the source electrode 124 shown in FIG. 1B.

Figure 5A:
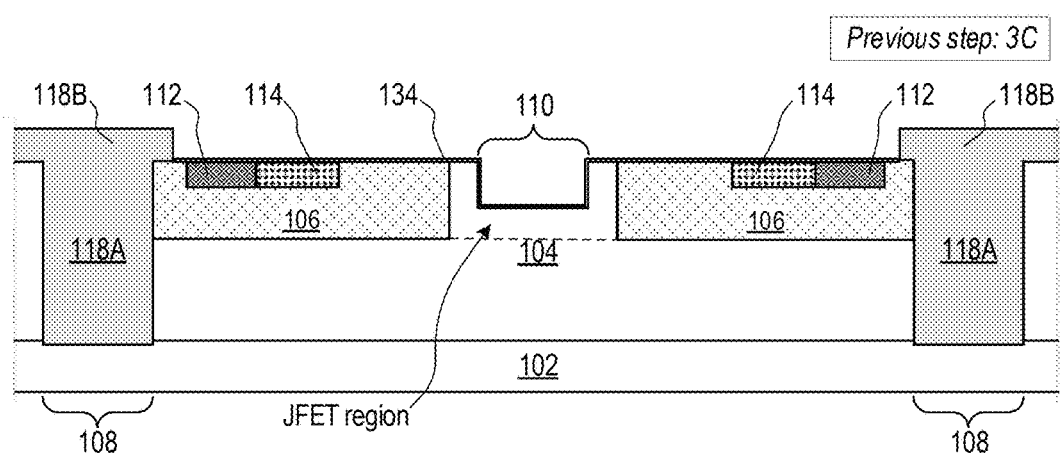
FIGS. 5A through 5C illustrate steps occurring after the steps shown in FIGS. 3A through 3C in a semiconductor device manufacturing process according to another embodiment.
Figure 5B:
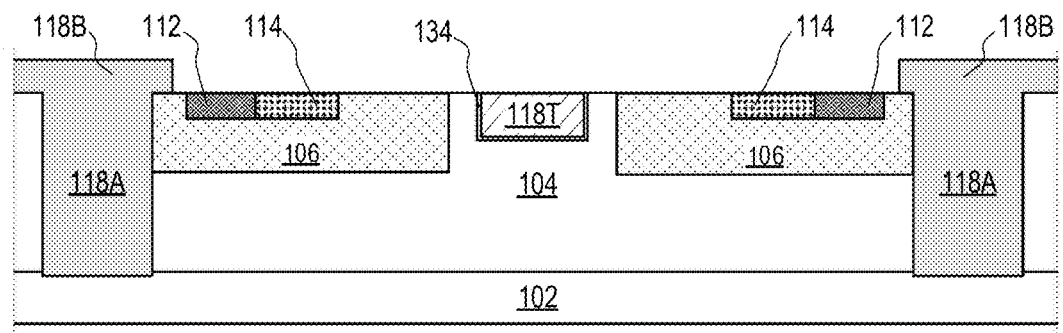
Figure 5C:
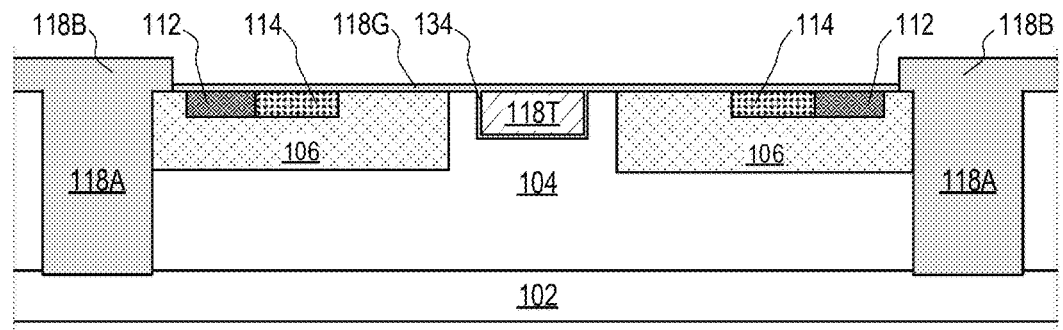

FIGS. 5A through 5C illustrate steps occurring after the steps shown in FIGS. 3A through 3C in a semiconductor device manufacturing process according to another embodiment.

In FIG. 5A, a shallow under-gate trench 110 has been formed in the JFET region of the epitaxy 104. A liner oxide 134 has been formed over surfaces of the under-gate trench 110. In an embodiment, the liner oxide 134 comprises silicon dioxide ($SiO_2$) with nitrogen content to passivate the interface traps.

In the embodiment shown, the liner oxide 134 is also formed over top surfaces of the device outside the under-gate trench 110, but embodiments are not limited thereto.

In FIG. 5B, the under-gate trench 110 has been filled with trench dielectric 118T and portions of the liner oxide 134 outside the under-gate trench 110 have been removed.

In FIG. 5C, a gate dielectric 118G has been formed over the JFET region, the under-gate trench 110, the exposed portions of the P-bodies 106, the source regions 114, and the highly doped regions 112.

Processing may then continue using techniques and materials disclosed herein and those known in the related arts to produce an embodiment such as the VMOSFET 100C of FIG. 1C.

Figure 6A:
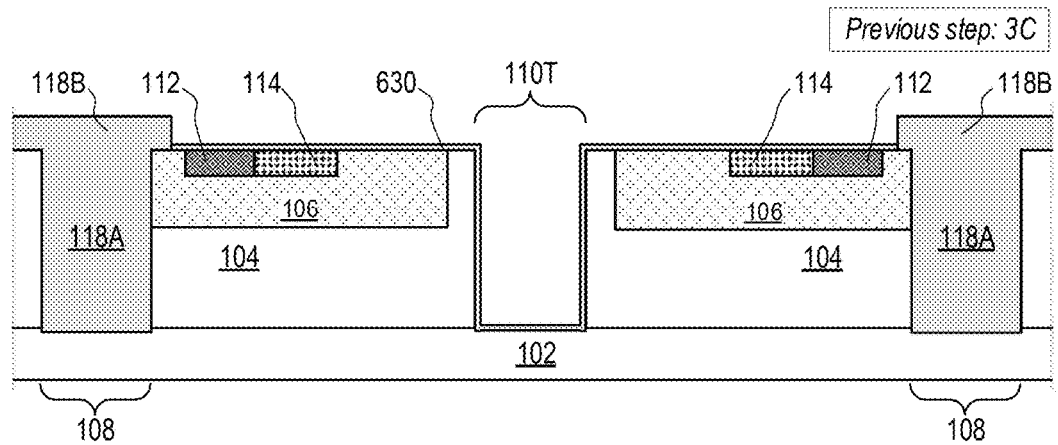
FIGS. 6A and 6B illustrate steps occurring after the steps shown in FIGS. 3A through 3C in a semiconductor device manufacturing process according to another embodiment.
Figure 6B:
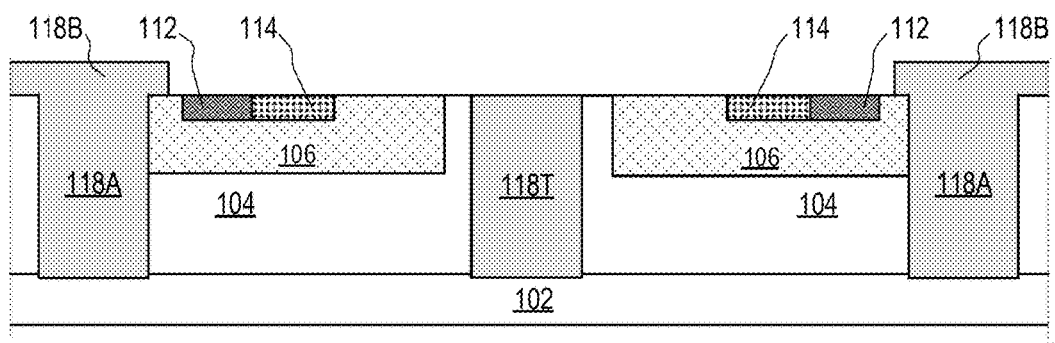

FIGS. 6A and 6B illustrate steps occurring after the steps shown in FIGS. 3A through 3C in a semiconductor device manufacturing process according to another embodiment.

In FIG. 6A, a deep under-gate trench 110T has been formed in the JFET region of the epitaxy 104. The deep under-gate trench 110T as shown in FIG. 6A penetrates the entire thickness of the epitaxy 104 and a portion of the substrate 102, but embodiments are not limited thereto. In an embodiment, a bottom of the deep under-gate trench 110T is lower than a metallurgical junction between a bottom of the P-bodies 106 and the epitaxy 104.

A sacrificial oxide 630 has been grown over surfaces of the deep under-gate trench 110T to improve the quality of those surfaces. In an embodiment, the sacrificial oxide 630 comprises silicon dioxide ($SiO_2$) formed by thermal oxidation.

In the embodiment shown, the sacrificial oxide 630 is also formed over top surfaces of the device outside the deep under-gate trench 110T, but embodiments are not limited thereto.

In FIG. 6B, the sacrificial oxide 630 has been stripped off. After the sacrificial oxide 630 was removed, the deep under-gate trench 110T was filled with a trench dielectric 118T.

Processing may then continue using techniques and materials disclosed herein and those known in the related arts to produce an embodiment such as the VMOSFET 100E of FIG. 1E or the VMOSFET 1G of FIG. 1G.

Figure 7A:
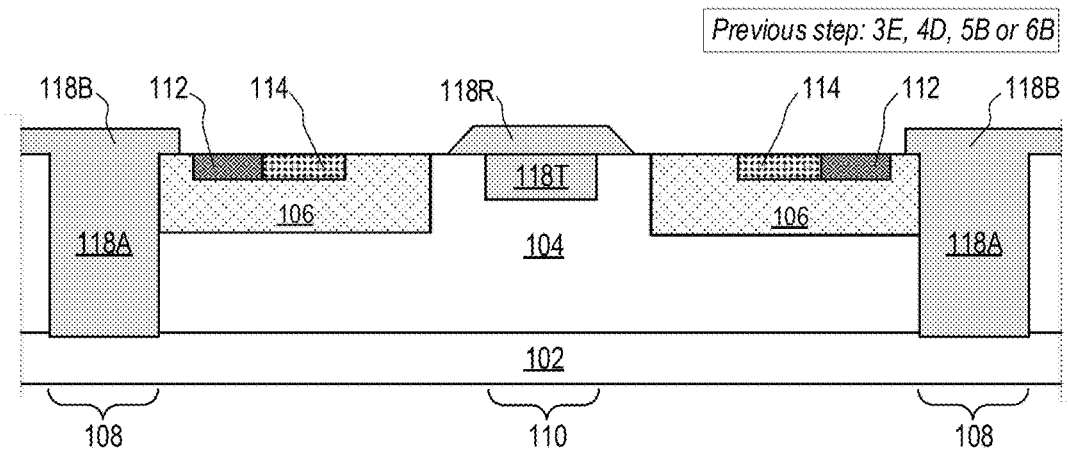
FIGS. 7A through 7C illustrate steps occurring after the steps shown in FIGS. 3A through 3E in a semiconductor device manufacturing process according to another embodiment.
Figure 7B:
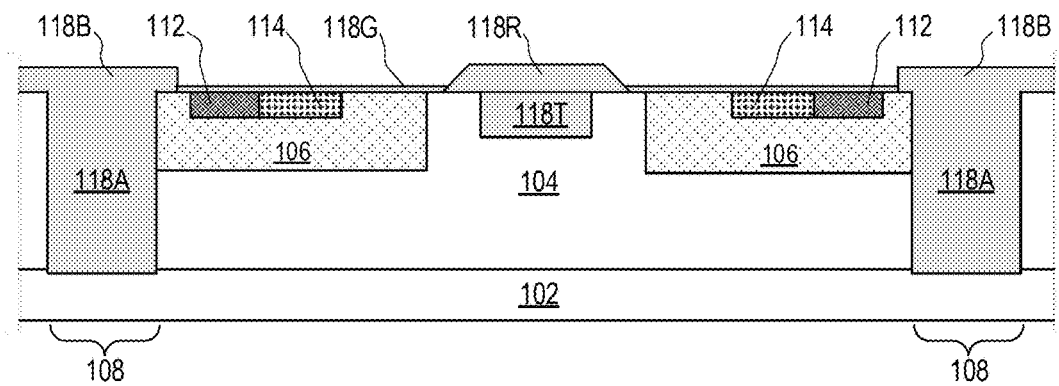
Figure 7C:
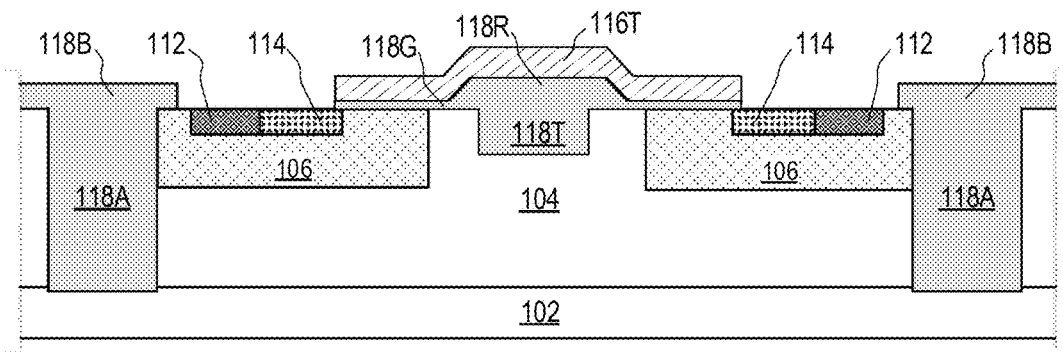

FIGS. 7A through 7C illustrate steps occurring after the steps shown in FIGS. 3A through 3E in a semiconductor device manufacturing process according to another embodiment. The steps shown in FIG. 7A through 7C may also be performed after the steps shown in FIGS. 4A through 4D, the steps shown in FIGS. 3A through 3C and 5A through 5B, or the steps shown in FIGS. 3A through 3C, 6A, and 6B. However, embodiments are not limited thereto.

In FIG. 7A, a raised oxide 118R has been formed over the trench 110. The raised oxide may have been formed by depositing an oxide over the surface of the device, masking the oxide, and then etching away the oxide not covered by the mask.

In FIG. 7B, a gate dielectric 118G has been formed over the JFET region, the exposed portions of the P-bodies 106, the source regions 114, and the highly doped regions 112. In embodiments, the gate dielectric 118G is also formed over the raised oxide 118R.

FIGS. 7A and 7B show the raised oxide 118R being formed before deposition of the gate dielectric 118G, but embodiments are not limited thereto. In an embodiment, the gate dielectric 118G is formed over the JFET region, the under-gate trench 110, the exposed portions of the P-bodies 106, the source regions 114, and the highly doped region 112, and then the raised oxide 118R is formed over the gate dielectric 118G and over the trench 110.

In FIG. 7C, a gate electrode 116T has been formed over the gate dielectric 118G and the raised oxide 118R, the gate electrode 116T being disposed over the JFET region, the trench 110, portions of the P-bodies 106 and portions of the source regions 114. The portions of the gate dielectric 118G not covered by the gate electrode 116 have been removed. In an embodiment, the gate electrode 116 may comprise polysilicon.

Processing may then continue using techniques and materials disclosed herein and those known in the related arts to produce an embodiment such as the VMOSFET 100F of FIG. 1F or, when the step of FIGS. 7A though 7C are performed after the steps of FIGS. 3A through 3C, 6A, and 6B, the VMOSFET 100G of FIG. 1G.

Figure 8:
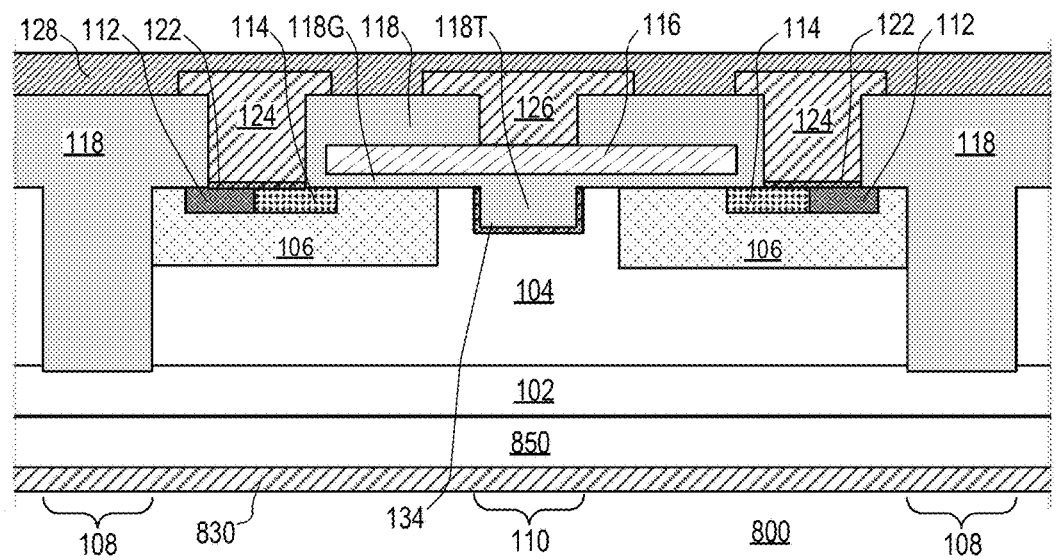
FIG. 8 illustrates a Vertical Insulated Gate Bipolar Transistor (VIGBT) according to an embodiment.

FIG. 8 illustrates a Vertical Insulated Gate Bipolar Transistor (VIGBT) 800 according to an embodiment.

The VIGBT 800 differs from the VMOSFET 100C of FIG. 1C in that a p-type layer 850 is formed over the bottom surface of the substrate 102, and a collector contact 830 is formed on the bottom surface of the p-type layer 850 instead of the drain contact 130. Source contacts 124 may be considered emitter contacts of the VIGBT 800.

The p-type layer 850 may be formed by implantation or may be grown epitaxially on the bottom surface of the substrate 102. The collector contact 830 may generally be formed as described for the drain contact 130.

In the VIGBT 800, the under-gate trench 110 provides advantages similar to those described with respect to FIG. 1A.

Figure 9:
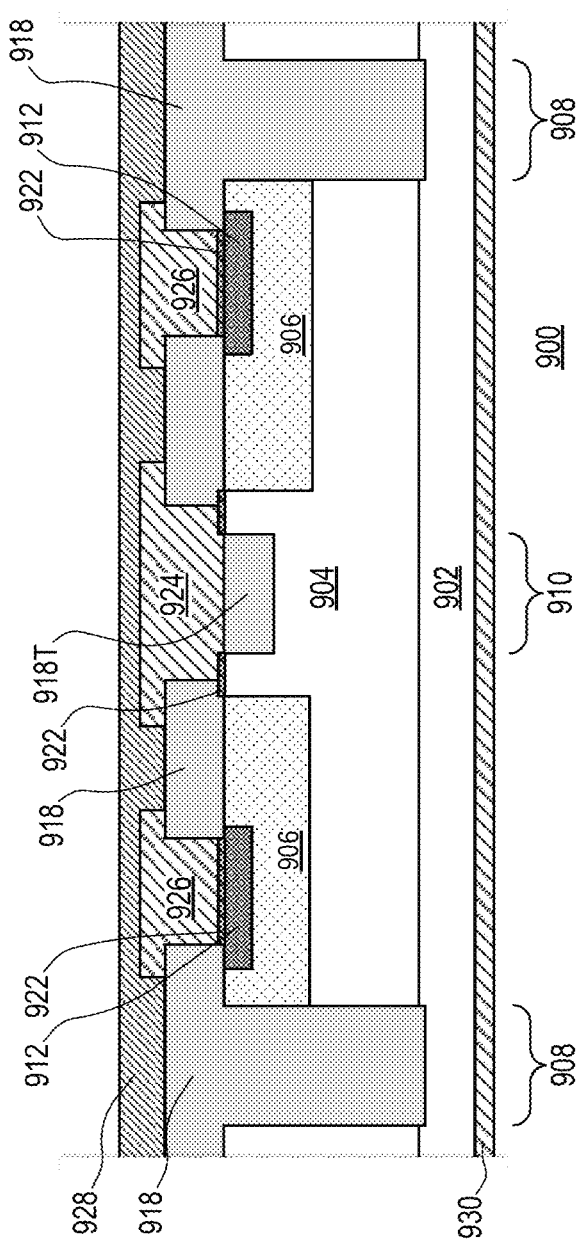
FIG. 9 illustrates a Vertical Junction Field Effect Transistor (VJFET) according to an embodiment.

FIG. 9 illustrates a Vertical Junction Field Effect Transistor (VJFET) 900 in accordance with an embodiment.

The VJFET 900 comprises a substrate 902 of a semiconductor material on which an epitaxial layer (hereinafter, epitaxy 904) has been formed. The epitaxy 904 may be grown on the substrate 902. The substrate 902 may be of the same semiconductor material and the same conductivity type as the epitaxy 904 but may be more heavily doped (and therefore have a higher conductance) than the epitaxy 904.

In embodiments, the substrate 902 and epitaxy 904 may include a wide bandgap semiconductor such as SiC, and may be n-type material, but embodiments are not limited thereto. For example, in embodiments, the substrate 902 and epitaxy 904 may include silicon, gallium nitride (GaN), aluminum gallium nitride (AlGaN), high aluminum content AlGaN, beta gallium trioxide ($\beta$-$Ga_2O_3$), diamond, boron nitrides, and the like. In other embodiments, the substrate 902 and epitaxy 904 may be p-type materials.

P-bodies 906 are formed in the epitaxy 904 in an area surrounded by deep trenches 908. A shallow region 912 of heavily doped p-type material is formed in each of the P-bodies 906 to provide connections to the P-bodies 906 with a low contact resistance by increasing the doping concentration near the surface of the semiconductor.

A region of the epitaxy 904 between the P-bodies 906 corresponds to a JFET region having a same conductivity type (here, n-type) as the epitaxy 904. In some embodiments, the JFET region may have a substantially higher doping concentration than the epitaxy 904 to minimize its contribution to the drift resistance.

A shallow trench 910 is formed spanning the center of the JFET region of the epitaxy 904. In an embodiment, a sacrificial oxide layer (not shown) may have been formed over the surfaces of the shallow under-gate trench 910 to improve the quality of thereof and may have been removed by subsequent processing. In another embodiment, the shallow under-gate trench 910 may be formed with a P-shield disposed in the center of the JFET region, similarly to as described with respect to FIGS. 4B and 4C.

The deep trenches 908 are filled with a dielectric 918. The dielectric 918 is also disposed over the top of the epitaxy 904 (including over the JFET region) and the P-bodies 906.

In embodiments, a portion of the dielectric 918 may be disposed in the shallow trench 910 to form the shallow trench dielectric 918T. In other embodiments, the shallow trench dielectric 918T is a different material than the dielectric 918.

In an embodiment, the dielectric 918 includes silicon dioxide ($SiO_2$), borophosphosilicate glass (BPSG), a low dielectric permittivity ("low-k" material) such as but not limited to BenzoCycloButene (BCB), or combinations thereof.

In an embodiment, the shallow trench dielectric 918T includes $SiO_2$, a material with low dielectric permittivity ("low-k" material), undoped polysilicon, or combinations thereof.

A source contact 924 is formed over and in electrical contact with the epitaxy 904 in the JFET region. The source electrode 924 may comprise aluminum, among other conductors, and may be electrically connected to the epitaxy 904 by respective silicide layers 922. In an embodiment, the silicide layers 922 may comprise nickel silicide, or may be a silicide of another metal capable of forming an ohmic contact with the epitaxy 904.

Gate contacts 926 are formed over and in electrical contact with the P-bodies 906. The gate contacts 926 may comprise aluminum, among other conductors. In embodiments, the gate contacts 926 may be electrically connected to the P-bodies 906 by respective silicide layers 922. In an embodiment, the silicide layers 922 may comprise nickel silicide, or may be a silicide of another metal capable of forming an ohmic contact with the region 912 of heavily doped p-type material.

A passivation layer 928 is formed over the dielectric 918, source contacts 924, and gate contact 926. In an embodiment, the passivation layer 928 may include silicon oxynitride (SiON).

A drain contact 930 comprising a conductor, such as silver, is formed over and electrically connected to a bottom surface of the substrate 902. In an embodiment, the drain contact 930 is electrically connected to the substrate 902 using a silicide layer (not shown) formed over the bottom surface of the substrate 902. In an embodiment, the silicide layers 922 may comprise nickel silicide.

Similarly as for VMOSFETs and VIGBTs, the shallow trench 910 allows the gate pitch of a VJFET to be increased without degrading the electrical performance. In particular, the gate pitch could be wide enough to design metal lines side by side for the source and the gate connections, hence making the VJFET suitable for high-frequency operation.

The channel of a WET is formed between the P-bodies 906 and is controlled in off and on-states by the potential applied to the P-bodies 906 through the gate connection 926. The depletion region near the metallurgical junction between the P-bodies 906 and the epitaxy 904 gets wider as the voltage between the gate and the source is reduced and the channel gets closed when the depletions regions on both side of the JFET region touches each other. In a conventional VJFET, a wider gate pitch requires higher gate bias and capacitive charge to close the channel or a lower doping concentration in the JFET region, at the expense of a higher drift resistance. With a shallow trench in the JFET region, the channel gets closed when the depletion region from the P-bodies 906 reaches the sidewalls of the trench 910. By adjusting the distance between the P-bodies 906 and the trench 910, the gate voltage to control the channel and the doping in the JFET region can be optimized for low switching and conduction losses in power conversion applications.

Illustrative embodiments have been provided wherein a trench spanning the center of a JFET region of a vertical semiconductor device. When the vertical semiconductor device is a VMOSFET or VIGBT, the trench operates to protect the center of a gate dielectric disposed over the JFET region from high electric fields that could lead to breakdown of the gate dielectric, which breakdown could permanently damage the device. Furthermore, the trench may reduce or eliminates the detrimental performance effects that may arise from the use a wide gate pitch, such as when metalized gates are used.

Aspects of the present disclosure have been described in conjunction with the specific embodiments that are presented as illustrative examples, but embodiments are not limited to those shown in the drawings or those mentioned in the accompanying text. Numerous alternatives, modifications, and variations to the disclosed embodiments may be made without departing from the scope of the claims set forth below. Embodiments disclosed herein are not intended to be limiting.

What is claimed is:

1. A semiconductor device comprising:
a semiconductor substrate having a first conductivity type;
a semiconductor layer formed over the substrate and having the first conductivity type;
a pair of doped bodies formed in the semiconductor layer and having a second conductivity type opposite the first conductivity type;
a trench formed within a region between the doped bodies;
a trench dielectric disposed within the trench;
a polysilicon fill formed within the trench dielectric and separated from the gate electrode by a gate dielectric; and
a gate electrode disposed over the region between the doped bodies and over the trench.

2. The semiconductor device of claim 1, wherein the trench penetrates the semiconductor layer to a depth greater than a depth of a metallurgical junction between the bottom of one of the doped bodies and the semiconductor layer.

3. The semiconductor device of claim 1, wherein the trench penetrates an entire thickness of the semiconductor layer.

4. The semiconductor device of claim 1, further comprising:
the gate dielectric disposed over the region between the doped bodies and over the trench,
wherein the gate electrode is disposed over the gate dielectric.

5. The semiconductor device of claim 4, wherein the trench operates to provide the gate dielectric with immunity to dielectric breakdown caused by heavy-ion bombardment.

6. The semiconductor device of claim 1, further comprising:
a shield region formed within the region between the doped bodies and having the second conductivity type,
wherein the trench is disposed within the shield region.

7. The semiconductor device of claim 6, further comprising:
a source region disposed in one of the doped bodies and having the first conductivity type,
wherein the shield region is electrically connected to the source region.

8. The semiconductor device of claim 1, further comprising:
a liner oxide formed over surfaces of the trench before the trench dielectric is disposed within the trench,
wherein the trench dielectric is disposed within the liner oxide.

9. The semiconductor device of claim 8, wherein a composition of the liner oxide is different from a composition of the trench dielectric.

10. The semiconductor device of claim 1, wherein the semiconductor substrate comprises silicon carbide and the semiconductor layer comprises silicon carbide.

11. A semiconductor device comprising:
a semiconductor substrate having a first conductivity type;
a semiconductor layer formed over the substrate and having the first conductivity type;
a pair of doped bodies formed in the semiconductor layer and having a second conductivity type opposite the first conductivity type;
a trench formed within a region between the doped bodies;
a trench dielectric disposed within the trench;
a raised dielectric disposed over the trench and not over the doped bodies; and
a gate electrode disposed over the region between the doped bodies and over the trench,
wherein the gate electrode is disposed over a gate dielectric and the raised dielectric, and wherein an elevation over the substrate of a portion of the gate electrode over the raised dielectric is greater than an elevation over the substrate of a portion of the gate electrode not over the raised dielectric.

12. The semiconductor device of claim 11, wherein the trench penetrates the semiconductor layer to a depth greater than a depth of a metallurgical junction between the bottom of one of the doped bodies and the semiconductor layer.

13. A method of manufacturing a semiconductor device, the method comprising:
forming a semiconductor layer of a first conductivity type on a semiconductor substrate of the first semiconductor type;
forming a pair of doped bodies having a second conductivity type opposite the first conductivity type in the semiconductor layer;
forming a trench in a region between the doped bodies;
forming a trench dielectric within the trench;
forming a cavity in the trench dielectric;
forming a polysilicon fill within the cavity in the trench dielectric; and
forming a gate electrode over the region between the doped bodies including over the trench.

14. The method of claim 13, further comprising:
forming a sacrificial oxide over surfaces of the trench; and
removing the sacrificial oxide from the surfaces of the trench before forming the trench dielectric.

15. The method of claim 13, wherein the trench penetrates the semiconductor layer to a depth greater than a depth of a metallurgical junction between the bottom of one of the doped bodies and the semiconductor layer.

16. The method of claim 13, wherein the trench penetrates an entire thickness of the semiconductor layer.

17. The method of claim 13, further comprising:
forming a gate dielectric over the region between the doped bodies including over the trench; and
forming the gate electrode over the gate dielectric.

18. The method of claim 17, wherein the trench operates to provide the gate dielectric with immunity to dielectric breakdown caused by heavy-ion bombardment.

19. The method of claim 13, further comprising:
forming a shield region within the region between the doped bodies and having the second conductivity type before forming the trench; and
forming the trench in the shield region.

20. The method of claim 19, further comprising:
forming a source region in one of the doped bodies and having the first conductivity type,
wherein the shield region is electrically connected to the source region.

21. The method of claim 13, further comprising:
forming liner oxide over surfaces of the trench before forming the trench dielectric; and
forming the trench dielectric within the liner oxide.

22. The method of claim 13, wherein the semiconductor substrate comprises silicon carbide and the semiconductor layer comprises silicon carbide.

23. A method of manufacturing a semiconductor device, the method comprising:
forming a semiconductor layer of a first conductivity type on a semiconductor substrate of the first semiconductor type;
forming a pair of doped bodies having a second conductivity type opposite the first conductivity type in the semiconductor layer;
forming a trench in a region between the doped bodies;
forming a trench dielectric within the trench;
forming a gate electrode over the region between the doped bodies including over the trench;
forming a gate dielectric over the region between the doped bodies including over the trench;
forming a raised dielectric disposed over the trench and not over the bodies; and
forming a gate electrode over the gate dielectric and over the raised dielectric,
wherein an elevation over the substrate of a portion of the gate electrode over the raised dielectric is greater than an elevation over the substrate of a portion of the gate electrode not over the raised dielectric.

24. The semiconductor device of claim 23, wherein the trench penetrates the semiconductor layer to a depth greater than a depth of a metallurgical junction between the bottom of one of the doped bodies and the semiconductor layer.

* * * * *